United States Patent [19]

Kobayashi et al.

[11] Patent Number: 5,172,215
[45] Date of Patent: Dec. 15, 1992

[54] OVERCURRENT-LIMITING TYPE SEMICONDUCTOR DEVICE

[75] Inventors: Shinichi Kobayashi; Shinichi Ito; Toshio Ohkubo; Takeki Okabayashi, all of Kanagawa, Japan

[73] Assignee: Fuji Electric Co., Ltd., Kanagawa, Japan

[21] Appl. No.: 664,788

[22] Filed: Mar. 5, 1991

[30] Foreign Application Priority Data

Mar. 6, 1990 [JP] Japan .................................. 2-54342
Sep. 20, 1990 [JP] Japan ................................ 2-253165

[51] Int. Cl.$^5$ .......................................... H01L 23/16
[52] U.S. Cl. ..................................... 257/584; 361/91; 257/687; 257/693; 257/724
[58] Field of Search ............................ 357/74, 75, 67

[56] References Cited

U.S. PATENT DOCUMENTS 4,920,405 4/1990 Itoh et al. ............................ 357/74

FOREIGN PATENT DOCUMENTS 58-81313 5/1983 Japan .

Primary Examiner—Frank Gonzalez
Attorney, Agent, or Firm—Finnegan, Henderson, Farabow, Garrett and Dunner

[57] ABSTRACT

An overcurrent-limiting type semiconductor device comprising a transistor chip fixed on the bottom of a package, the package being constructed of a bottom plate, side walls, and a lid, terminal conductors connected to electrodes of the transistor chip and drawn through the lid of the package to the outside of the package, and a current-limiting circuit connected between a base and emitter of the transistor chip. The current-limiting circuit comprises a conductor layer provided on the bottom plate of the package, and a multilayer type diode chip including a plurality of diodes constructed in a multilayer fashion and a first electrode. The multilayer type diode chip is fixed to the conductor layer at the first electrode.

6 Claims, 3 Drawing Sheets

IMPROVEMENT OF TEMPERATURE CHARACTERISTICS OF $V_F$ USING $R_z$

OVERCURRENT-LIMITING TYPE SEMICONDUCTOR DEVICE

BACKGROUND OF THE INVENTION

1. Field of the Invention

The present invention relates to the construction of a semiconductor device having a transistor chip fixed on the bottom of a package, the package being formed of a bottom plate, side walls, and a lid, terminal conductors connected to the transistor chip and drawn through the lid of the package to the outside of the package, and diodes connected between the base and emitter of the transistor chip for preventing an overcurrent from flowing through the transistor chip.

2. Description of the Related Art

Japanese Unexamined Patent Publication No. 58-81313 discloses a conventional overcurrent limiting semiconductor device comprising diodes 22 and 23 connected between a base B and emitter E of a transistor 21 as shown in FIG. 8 so that the emitter current $I_R$ is limited to values below a predetermined value. In the prior art device, when the emitter current $I_R$ increases, a voltage drop $RI_R$ across the emitter resistor R increases, causing the sum of the voltage drop $RI_R$ and the base-to-emitter voltage $V_{BE}$ to become greater than the sum of the forward voltage drops $V_F$ across the diodes 22 and 23. This results in a current $I_1$. Thus, the following equation holds true:

$$V_{BE} - V_F + RI_R = 0 \tag{1.0}$$

The emitter current $I_R$ is limited below a certain value due to the fact that the forward I-V curves of the diodes 22 and 23 rise sharply such that the diodes 22 and 23 represent a constant voltage diode having a substantially constant forward voltage $V_F$. The diode connection of FIG. 8 may also be applied to a Darlington transistor wherein the diodes are connected between the base of the first-stage transistor and the emitter of the final stage transistor.

Conventionally, such overcurrent-limiting type semiconductor devices are of the construction in which a transistor chip is fixed to the bottom of a package, the package being formed of a bottom plate, side walls, and a lid, and respective terminal conductors are connected to the base, emitter, and collector of the transistor chip and are drawn to the outside of the package through the package lid. Further, the current-limiting diodes are disposed in a space between the transistor chip and the lid and are connected between the base and emitter of the transistor by means of the base and emitter terminal conductors.

In the aforementioned prior art overcurrent-limiting type semiconductor devices, the diodes are located between the lid and the transistor chip on the bottom plate. This results in congested internal wiring when a complicated circuit is to be fabricated. The congested wiring may possibly cause the shorting-out of the diode leads and, therefore, difficulties may arise when assembling the device.

For example, if the package is to be made thin for the miniaturization of a power conversion apparatus to which the overcurrent-limiting type semiconductor device is applied, the space between the bottom of the package and the lid will be smaller resulting in further congestion of internal wires. As a result, there may be difficulty in providing sufficient space for accommodating the diodes.

If the diodes are disposed near the transistor chip, heat generated by the transistor chip will cause the forward voltage drop $V_F$ of the diodes to decrease and the resistance of the emitter resistor to increase. These two factors will act on the transistor simultaneously thereby limiting the transistor emitter current to a value much lower than it was designed to be.

SUMMARY OF THE INVENTION

An object of the present invention is to provide an overcurrent-limiting type semiconductor device in which the routing of the diode leads is simplified to reduce the space required for accommodating the diodes thereby implementing a thin construction of the package.

Another object of the present invention is to provide an overcurrent-limiting type semiconductor device for compensating for the temperature characteristics of the circuit to prevent the limit value of the transistor emitter current from being decreased by heat generated by the transistor chip.

These and other objects are attained by an overcurrent-limiting type semiconductor device according to the present invention in which a transistor chip is fixed on the bottom of a package, the package being constructed of a bottom plate, side walls, and a lid, terminal conductors are connected to the electrodes of the transistor chip and drawn through the lid to the outside of the package, and a current-limiting circuit is connected between the base and emitter of the transistor chip. The current-limiting circuit comprises a multilayer type diode chip comprising a plurality of diodes connected in a multilayer fashion, and a conductor layer provided on the bottom of the package.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention. In the drawings.

DESCRIPTION OF THE PREFERRED EMBODIMENTS

Figure 1:
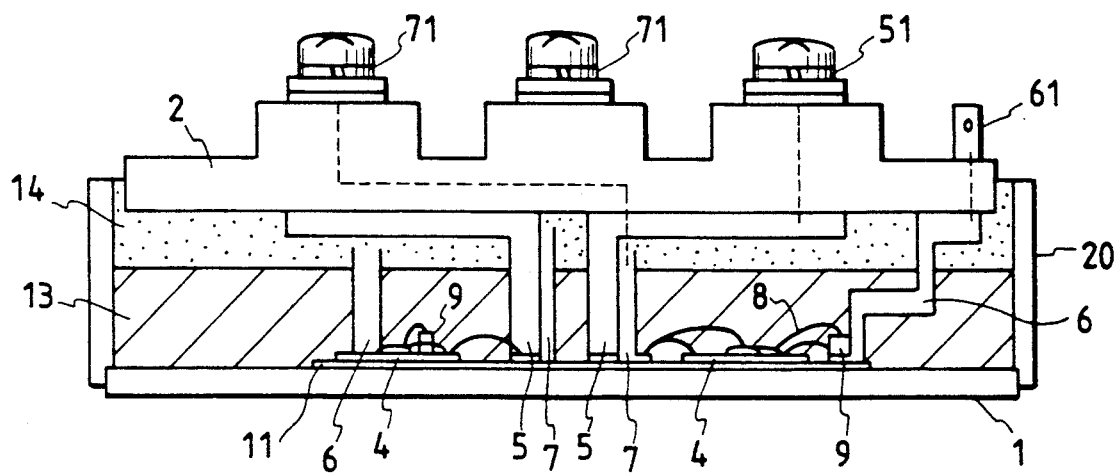
FIG. 1 is a cross-sectional view of an overcurrent-limiting type semiconductor device according to the present invention.

In the present invention, an overcurrent-limiting type semiconductor device includes a transistor chip fixed on the bottom of a package, the package being constructed of a bottom plate, side walls, and a lid. Terminal conductors are connected to the electrodes of the transistor chip and drawn through the lid to the outside of the package, and a current-limiting circuit is connected between the base and emitter of the transistor chip. The current-limiting circuit comprises a multilayer type diode chip comprising a plurality of diodes connected in a multilayer fashion, and a conductor layer provided on the bottom of the package. The multilayer diodes are fixed at one electrode thereof on the conductor layer. The diode chip may be connected in series with a temperature compensation resistor chip also fixed on the bottom of package. The multilayer diode chip may be of the construction in which the diodes and the temperature compensation resistor are stacked one on top of the other. One electrode of the multilayer diode chip may be of Ni or Au and the other of Al.

The use of a multilayer diode chip in the current-limiting circuit not only eliminates the need for leads which would be required for connecting a plurality of discrete diodes in series, but also minimizes the space needed for accommodating the diodes. The multilayer diode is directly connected at one of its ends to the conductor layer on the bottom plate. This reduces the amount of space required between the lid and the bottom of the package allowing for miniaturization and a thin construction of the package, and prevents the congestion of internal wiring and simplifies manufacturing stages.

The construction in which the series circuit of the temperature compensation resistor chip and the multilayer diode chip are fixed on the bottom plate, permits an increase in resistance of the temperature compensation resistor to compensate for a decrease in forward voltage drop of the multilayer diodes caused by heat generated by the transistor chip. Thus, the limit value of the emitter current of the transistor is prevented from being limited at a much lower value than is designed. Further, this construction allows the current limiting circuit to be located near the transistor chip for miniaturization of the device.

If the multilayer diode chip construction includes the temperature compensating resistor layer, the temperature rise of the diode layer is substantially the same as that of the resistor layer wherever the diode chip is disposed. This allows adverse effects resulting from increases in temperature to be completely compensated. The construction also eliminates the need for wires between the multilayer diode chip and the temperature compensating resistor so that the number of wires routed within the package is decreased, which is advantageous for miniaturization of the package.

One of the electrodes of the multilayer diode chip may be made of Ni or Au and the other of Al. The Ni or Au electrode is soldered to the conductive layer while the Al electrode is directly bonded with Al wire. These electrodes facilitate mounting of the multilayer diode chip and the wiring thereof thereby decreasing the number of assembly stages and required assembly time.

Reference will now be made in detail to presently preferred embodiments of the invention as illustrated in the accompanying drawings, in which like reference characters designate like or corresponding parts throughout the several drawings.

FIG. 1 shows the general construction of an overcurrent-limiting type semiconductor device according to the present invention. A package is constructed of side walls 20 bonded to a bottom copper plate 1, and a lid 2 that covers the top of the walls 20. An insulator 11 is brazed on the bottom plate 1. On the insulator 11 are mounted a transistor chip 4, a collector terminal conductor 5, a base terminal conductor 6, an emitter terminal conductor 7, and a multilayer diode chip 9, which are interconnected by means of aluminum wires 8. The collector terminal conductor 5, base terminal conductor 6, and emitter terminal conductor 7 are run through the lid 2 and are connected to a collector terminal 51, base control terminal 61, and emitter terminal 71, respectively. Within the package, the transistor 4 is covered by a silicone resin 13 having an epoxy resin 14 applied thereon.

Figure 2:
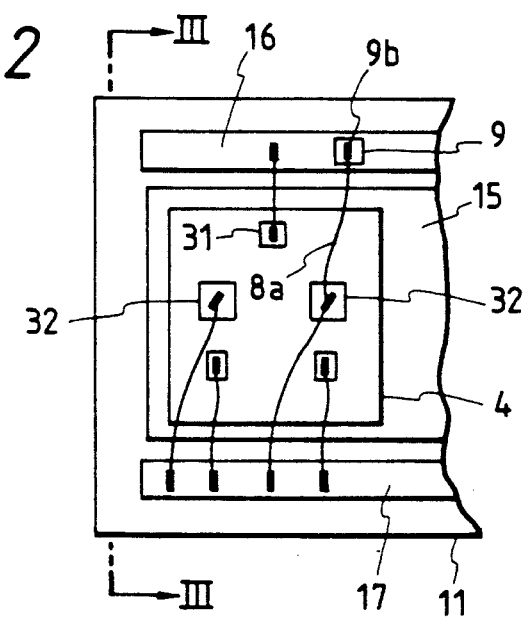
FIG. 2 is a top view of a first embodiment of the present invention showing a transistor and a peripheral area thereof.
Figure 3:
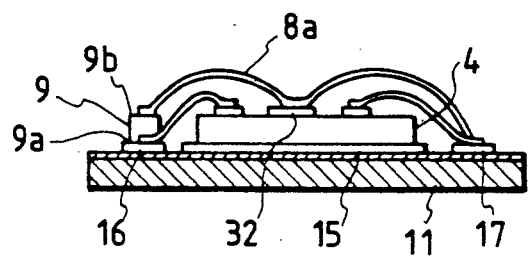
FIG. 3 shows a cross-section taken along the line III—III of FIG. 2.

FIG. 2 is a detailed top view of the first embodiment of the present invention showing the transistor chip 4 and a peripheral area thereof. FIG. 3 shows a cross-section in part taken along the line III—III of FIG. 2. On the insulator 11 are formed a heat sink 15, a base conductive layer 16, and an emitter conductive layer 17. The heat sink 15 is electrically connected with the collector terminal conductor 5 and carries the transistor chip 4 which is silver-brazed on the heat sink. The base conductive layer 16 is electrically connected with the base terminal conductor 6 (shown in FIG. 1) and the base electrode pad 31 of the transistor chip 4. The emitter conductive layer 17 is electrically connected with the emitter terminal conductor 7 (shown in FIG. 1) and emitter electrode pad 32. To the base conductive layer 16 is fixedly provided an anode electrode 9a of multilayer diode 9 whose cathode electrode 9b is connected with the emitter electrode pad 32 by means of an aluminum wire 8a. The aforementioned elements are all fixedly formed on the insulator 11, and the current-limiting circuit consists only of the multilayer diode 9 and the aluminum wire 8a, resulting in no densely routed wires or complexity of assembly stages.

Furthermore, the multilayer diode 9 is 0.5 to 2 millimeters high so that adding the current-limiting circuit does not significantly increase the occupied space in the package. Thus, not only the manufacturing stages are simplified but also the miniaturization and thin construction of the package are ensured.

Figure 4:
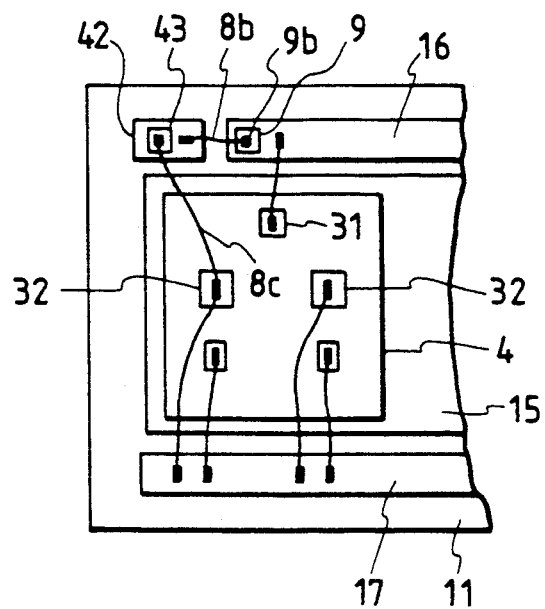
FIG. 4 is a top view of a second embodiment of the present invention showing a transistor and a peripheral portion thereof.

FIG. 4 is a top view of a second embodiment of the present invention showing the transistor chip 4 and a peripheral area thereof.

Figure 5:
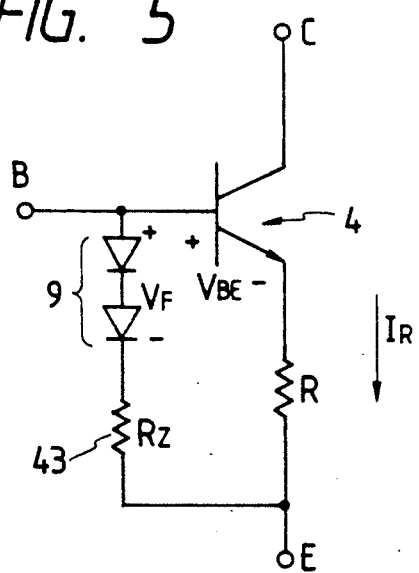
FIG. 5 is an equivalent circuit of the second embodiment shown in FIG. 4.
Figure 6:
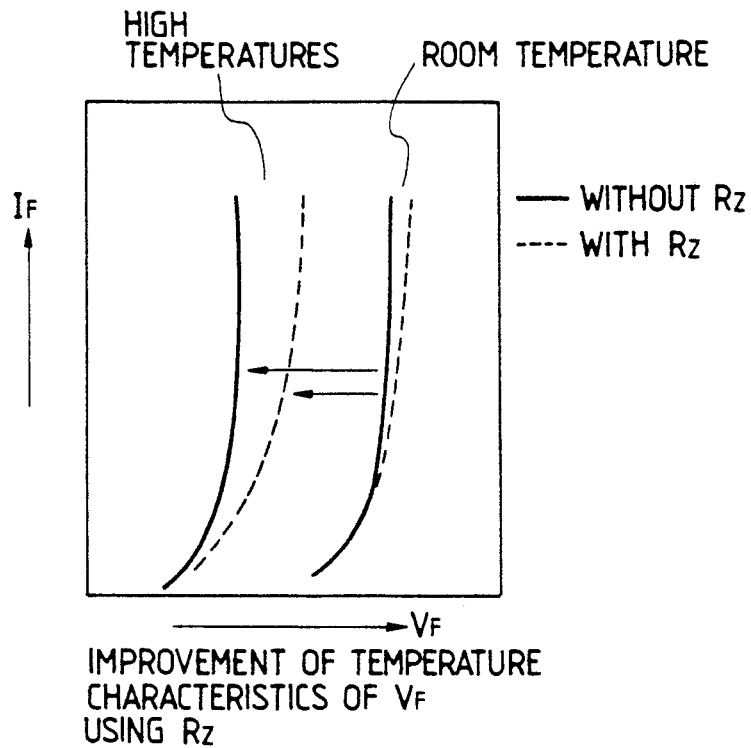
FIG. 6 shows the graphs of forward I-V characteristics of a multilayer diode chip according to the present invention wherein solid lines represent the I-V characteristics when a temperature compensation resistor Rz is not connected to the multilayer diodes of the multilayer diode chip and dotted lines represent the I-V characteristics when the temperature compensation resistor Rz is connected in series with the multilayer diodes.

The same elements as in the first embodiment have been given the same reference numerals and thus the detailed description thereof is omitted. In the second embodiment, a rectangular flat conductive layer 42 is formed on the insulator 11 and one of the electrodes of a resistor chip 43 is fixedly provided on the conductive layer 42. The conductive layer 42 is connected, by means of an aluminum wire 8b, with the cathode 9b of the multilayer diode chip 9, which is securely mounted on the base conductive layer 16. The other electrode of the resistor chip 43 is connected, via an aluminum wire 8c, with the emitter electrode pad 32 of the transistor chip 4. In this manner, as shown in the equivalent circuit of FIG. 5, the series circuit comprising the multilayer diode chip 9 and the resistor chip 43 is connected between the base and emitter of the transistor chip 4. In the second embodiment, the multilayer diode chip 9 and the resistor chip 43 are mounted on the insulator 11 at almost equal distances from the transistor chip 4. Thus, both the multilayer diode chip 9 and the resistor chip 43 experience the same temperature rise resulting from heat generated by the transistor chip 4. When the temperature of the transistor chip 4 increases, the forward voltage drop $V_F$ of the multilayer diode chip 9 decreases while the resistance $R_Z$ of the resistor chip 43 increases as the resistor chip 43 has a positive temperature coefficient. Thus, as shown in FIG. 6, a decrease in the forward voltage $V_F$ of the multilayer diode chip 9 is compensated by an increase in the resistance $R_Z$ of the resistor chip 43 thereby preventing the emitter current $I_R$ of the transistor chip 4 from being lowered. Thus, the multilayer diode chip 9 and the resistor chip 43 may be located close to the transistor chip 4 for miniaturized overall construction of the device.

Figure 7:
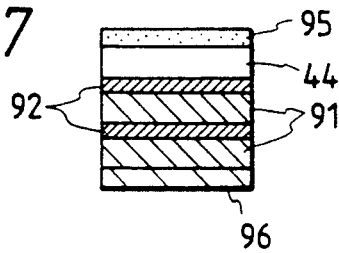
FIG. 7 is a cross-sectional view of the temperature compensation resistor stacked on the multilayer diodes within the multilayer diode chip.
Figure 8:
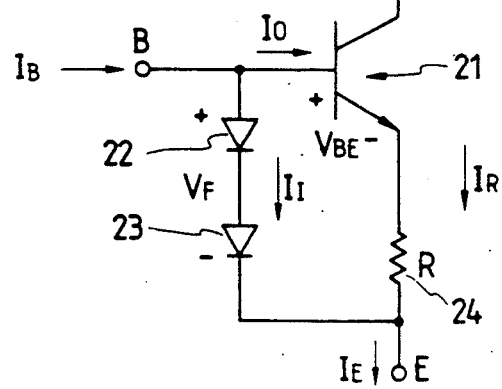
FIG. 8 is an equivalent circuit of a conventional overcurrent-limiting type semiconductor device.

As shown in FIG. 7, instead of connecting the resistor chip 43 in series with the multilayer diode chip 9, as previously described, the multilayer diode chip 9 can be constructed of a resistor layer 44 stacked over diode layers 91. The resulting device is as compact as in the first embodiment and the limiting value of the emitter current $I_R$ of the transistor chip 4 is less temperature dependent than in the first embodiment.

The resistor layer 44 and the respective diode layers 91 are bonded together by means of solder 92. The resistance Rz and temperature coefficient of the resistor layer 44 can be varied by changing the material and thickness thereof. Further, the resistor layer 44 may be formed of a plurality of stacked resistor layers.

Incorporating the resistor layer 44 into the multilayer diode chip 9 allows both the resistor layer 44 and diode layers 91 of the multilayer diode chip 9 to be subject to the same temperature no matter where the multilayer diode chip 9 is disposed in the package, thus reinforcing the above-described temperature compensation effect.

The stacked construction of the diode layers 91 and resistor layer 44 is formed with an Al electrode 95 on a top surface thereof and a Ni electrode 96 on a bottom surface thereof. The Al electrode 95 facilitates direct bonding of the aluminum wire 8b thereon while the Ni electrode 96 permits the bottom one of the diode layers 91 to be soldered to the conductive layer 42. An Au electrode may be used in place of the Ni electrode 96 for better solder-wetability. The electrode material thus selected permits direct connection of the multilayer diode chip 9 to the transistor chip 4 and also reduces the number of assembly stages and the assembly time required for assembling the device.

As mentioned above, an overcurrent-limiting type semiconductor device according to the present invention is characterized in that a multilayer diode chip as a current-limiting diode is fixed to a conductive layer on the bottom of a package. Thus, the present invention has the following advantages:

(1) Direct mounting of the multilayer diode chip on the conductive layer not only prevents congested wiring within the package but also reduces the space occupied by the circuits. This simplifies manufacturing stages and ensures a thin, miniaturized construction of the package.

(2) Fixing a series-circuit comprising the multilayer diode chip and a temperature compensation resistor chip on the bottom of the package prevents the limit-current of a transistor chip connected thereto from decreasing with increasing temperature. This allows a current-limiting circuit to be located close to the transistor chip to ensure miniaturization of the device.

(3) Incorporating a temperature compensation resistor within the multilayer diode chip eliminates the need for wires connecting the diode chip to the resistor chip. This simplifies the manufacturing stages and ensures thin construction and miniaturization of the package. No matter where the multilayer diode chip is disposed in the package, the diode layers and the resistor layer undergo the same temperature changes, thus reinforcing temperature compensation effects.

(4) The use of Ni or Au for one of the electrodes of the multilayer diode chip and Al for the other electrode facilitates mounting of the chip which reduces the number of assembly stages and assembly time.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. An overcurrent-limiting type semiconductor device comprising:
a transistor chip fixed on the bottom of a package, the package being constructed of a bottom plate, side walls, and a lid;
terminal conductors connected to electrodes of the transistor chip and drawn through the lid of the package to the outside of the package; and
a current-limiting circuit connected between a base and emitter of the transistor chip, the current-limiting circuit including:
a conductor layer provided on the bottom plate of the package, and
a multilayer type diode chip including a plurality of diodes constructed in a multilayer fashion and a first electrode, said multilayer type diode chip being disposed on the surface of said conductor layer and fixed to said conductor layer at said first electrode.

2. The overcurrent-limiting type semiconductor device according to claim 1, wherein said current-limiting circuit further comprises a temperature compensation resistor chip connected in series with said multilayer type diode chip, said temperature compensation resistor chip being fixed on the bottom plate of the package.

3. The overcurrent limiting type semiconductor device according to claim 1, wherein said multilayer type diode chip further includes at least one temperature compensation resistor layer disposed on and connected in series with said plurality of diodes.

4. The overcurrent-limiting type semiconductor device according to claim 1, further comprising a second electrode, said first electrode including any one of Ni and Al, and said second electrode including Al.

5. The overcurrent-limiting type semiconductor device according to claim 2, further comprising a second electrode, said first electrode including any one of Ni and Al, and said second electrode including Al.

6. The overcurrent-limiting type semiconductor device according to claim 3, further comprising a second electrode, said first electrode including any one of Ni and Al, and said second electrode including Al.

* * * * *